(12) United States Patent
Long

(10) Patent No.: US 11,276,741 B2
(45) Date of Patent: Mar. 15, 2022

(54) DISPLAY SUBSTRATE AND DISPLAY DEVICE

(71) Applicant: BOE TECHNOLOGY GROUP CO., LTD., Beijing (CN)

(72) Inventor: Chunping Long, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 82 days.

(21) Appl. No.: 16/612,925

(22) PCT Filed: May 29, 2019

(86) PCT No.: PCT/CN2019/088943
§ 371 (c)(1),
(2) Date: Nov. 12, 2019

(87) PCT Pub. No.: WO2020/042690
PCT Pub. Date: Mar. 5, 2020

(65) Prior Publication Data
US 2020/0335570 A1    Oct. 22, 2020

(30) Foreign Application Priority Data

Aug. 29, 2018 (CN) .......................... 201821401545.3

(51) Int. Cl.
*H01L 27/32* (2006.01)
*H01L 51/52* (2006.01)

(52) U.S. Cl.
CPC ...... *H01L 27/3276* (2013.01); *H01L 51/5253* (2013.01); *H01L 2227/323* (2013.01)

(58) Field of Classification Search
None
See application file for complete search history.

(56) References Cited

U.S. PATENT DOCUMENTS

2015/0348994 A1* 12/2015 Liu ..................... H01L 27/1259
257/773
2016/0035812 A1* 2/2016 Kwon ............... H01L 29/66757
257/40

(Continued)

FOREIGN PATENT DOCUMENTS

CN    103995409 A    8/2014
CN    107170679 A    9/2017

(Continued)

OTHER PUBLICATIONS

Office Action of KR Application No. 1020197035795 and English translation, dated Dec. 23, 2020, 14 pages.

(Continued)

*Primary Examiner* — Michelle Mandala
*Assistant Examiner* — Jordan M Klein
(74) *Attorney, Agent, or Firm* — Muncy, Geissler, Olds & Lowe, P.C.

(57) ABSTRACT

The present disclosure discloses a display substrate and a display device. The package structure of the display component includes: a base substrate, a display component arranged on a surface of the base substrate, and a package layer covering the display component, in which the display component includes a display area and a peripheral area surrounding the display area, and the peripheral area is provided with a signal line pattern having an inclined side along a direction perpendicular to an extending direction of the signal line pattern with a slope angle of less than 90 degrees.

14 Claims, 5 Drawing Sheets

(56) References Cited

U.S. PATENT DOCUMENTS

2016/0079278 A1  3/2016  Wei et al.
2017/0170201 A1* 6/2017  Chiu .................... H01L 27/124

FOREIGN PATENT DOCUMENTS

| CN | 208637462 U | 3/2019 |
| KR | 100862555 B1 | 10/2008 |
| KR | 20120072173 A | 7/2012 |
| WO | WO-2014127552 A1 | 8/2014 |

OTHER PUBLICATIONS

An Office Action dated Oct. 8, 2021 in IN Application No. 201947047731, 6 pages.

\* cited by examiner

DISPLAY SUBSTRATE AND DISPLAY DEVICE

CROSS-REFERENCE TO RELATED APPLICATION

This application is the U.S. national phase of PCT Application No. PCT/CN2019/088943 filed on May 29, 2019, which claims a priority to Chinese Patent Application No. 201821401545.3 filed on Aug. 29, 2018, the disclosures of which are incorporated in their entirety by reference herein.

TECHNICAL FIELD

The present disclosure relates to the field of display technology, in particular, to a display substrate and a display device.

BACKGROUND

With the continuous development of display technology, the application of display components is becoming more widespread. In order to prolong the service life of display components, the packaging problem of display components has gradually attracted more attention.

SUMMARY

The present disclosure provides the following technical solutions.

In an aspect, the present disclosure provides a display substrate includes: a base substrate, a display component arranged on a surface of the base substrate, and a package layer covering the display component, in which the display component includes a display area and a peripheral area surrounding the display area, and the peripheral area is provided with a signal line pattern having an inclined side along a direction perpendicular to the extending direction of the signal line pattern with a slope angle of less than 90 degrees.

In an embodiment, the signal line pattern has an inclined side with a slope angle of less than 60 degrees.

In an embodiment, the inclined side has a concave-convex structure protruded or depressed along the direction perpendicular to extending direction of the signal line pattern, the concave-convex structure includes a plurality of convex portions spaced apart from each other, and a concave groove is formed between adjacent two of the plurality of convex portions.

In an embodiment, the inclined side extends along an extending direction of the signal line pattern, and the maximum width of the signal line pattern along a direction perpendicular to an extending direction of the signal line pattern is between 2 µm and 30 µm. Further, the minimum width of the signal line pattern along a direction perpendicular to an extending direction of the signal line pattern is between 2 µm and 24 µm.

In an embodiment, the depressed depth of the concave groove along a direction perpendicular to the extending direction of the signal line pattern is equal to or less than 6 µm.

In an embodiment, a slope angle of the convex portion is less than a slope angle of a groove bottom of the concave groove.

In an embodiment, an orthogonal projection of the convex portion on the base substrate is rectangular, triangular, trapezoidal, and/or semicircular.

In an embodiment, the signal line pattern includes a first signal line sub-pattern and a second signal line sub-pattern arranged one on another, the first signal line sub-pattern is located between the second signal line sub-pattern and the base substrate, and an etching selection ratio of the first signal line sub-pattern to the second signal line sub-pattern is less than one under an etching effect of the same etching solution.

In an embodiment, the display component comprises a conductive film layer other than the signal line pattern, and the signal line pattern and one conductive film layer of the display component are arranged in a same layer and made of a same material.

In an embodiment, the signal line pattern includes a power supply line pattern.

In another aspect, the present disclosure also provides a display device including any one of the above display substrate.

BRIEF DESCRIPTION OF THE DRAWINGS

The drawings described herein are intended to provide a further understanding of the present disclosure, and constitute a part of this disclosure. The illustrative embodiments and the description thereof are merely intended to illustrate the present disclosure, and do not constitute an improper limitation of the present disclosure. In the drawings.

DETAILED DESCRIPTION

Figure 1:
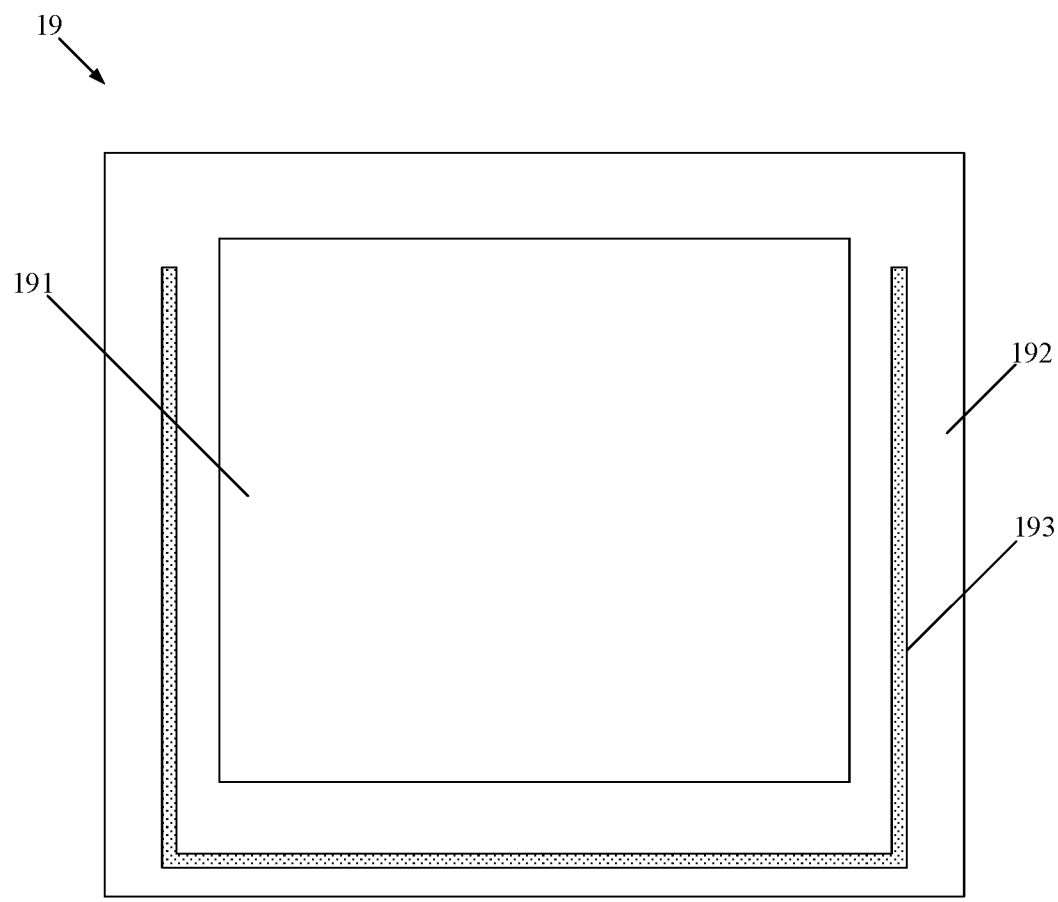
FIG. 1 is a top plan view showing a display component according to an embodiment of the present disclosure.

In order to further explain the display substrate and display device according to the embodiments of the present disclosure, the present disclosure will be described in detail hereinafter in conjunction with the drawings.

In the related art, a thin film package process is generally used to package an organic light-emitting diode (OLED) display component, to ensure the service life of the display component and meet the requirement for thinner development of the OLED display component.

However, in the related art, when the display component is packaged by the thin film package technology, the package layer cannot ensure the package effect on the signal line located in the peripheral area of the display component, and thus water and oxygen easily invade into the inside of the display component from the position where the signal line is located, thereby affecting the service life of the display component.

Specifically, in the related art, the structure of an OLED display component generally includes a thin-film transistor array layer formed on a base substrate, and a light-emitting unit prepared on the thin-film transistor array layer. The thin-film transistor array layer includes a thin-film transistor array, various control circuits, and gate lines, data lines, and other signal lines for controlling the normal operation of the control circuit and the thin-film transistor. Gate lines, data lines, and other signal lines are used to provide corresponding signals to the control circuit and the thin-film transistor, such that the control circuit cooperates with the thin-film transistor to drive the light-emitting unit to emit light.

Illustratively, the other signal lines described above may include power supply lines, but are not limited thereto. The following is illustrated by taking other signal lines including a power supply line as an example. The related OLED display component mainly includes a display area and a peripheral area surrounding the display area. The gate lines, the data lines, the thin-film transistor array, the control circuit and the light-emitting unit included in the OLED display component are generally located in the display area, and the power supply line included in the OLED display component is generally located in the peripheral area. When the OLED display component is packaged, a package layer capable of covering the OLED display component is mainly formed on the surface of the OLED display component, so that the OLED display component is completely isolated from the outside through the package layer. However, the package layer directly covers the power supply line located in the peripheral area, and the slope angles of both sides of the power supply lines along the extending direction thereof are generally right angles, so that when the display component is packaged by the thin film packaging technology, the package layer cannot ensure the package effect on both side edges of the power supply line along the extension direction thereof, and water and oxygen easily invade into the inside of the display component from the edge position of the signal line, thereby affecting the service life of the display component.

An object of the present disclosure is to provide a display substrate and a display device, for solving the problem that the package layer in the related art cannot ensure the package effect on the signal lines located in the peripheral region of the display component, thereby affecting the service life of the display component.

Figure 2:
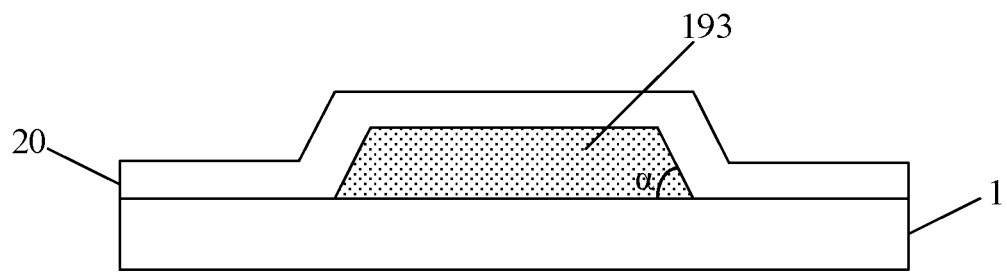
FIG. 2 is a first cross-sectional view showing a signal line pattern according to an embodiment of the present disclosure.

An embodiment of the present disclosure provides a display substrate, as shown in FIGS. 1 and 2, which includes: a base substrate 1, a display component 19 arranged on a surface of the base substrate, and a package layer 20 covering the display component 19. The display component 19 includes a display area 191 and a peripheral area 192 surrounding the display area 191. The peripheral area 192 is provided with a signal line pattern 193 having an inclined side with a slope angle α of less than 90 degrees.

In the present embodiment, when the signal line pattern 193 is prepared, for example, an immersion etching process can be specifically employed. In the immersion etching process, the base substrate 1 for preparing the signal line thin film of the signal line pattern 193 is placed in the immersion tank, and the base substrate 1 is kept stationary, so that the signal line thin film located on the base substrate 1 is etched by the etching solution in the immersion tank, to form a signal line pattern 193 having an inclined side with a slope angle of less than 90 degrees.

It should be noted that, when the signal line pattern 193 is actually prepared, the magnitude of the slope angle of the signal line pattern 193 can be controlled in various modes. Several specific modes are listed below, but are not limited thereto.

In the first mode, since the signal line pattern 193 to be formed needs to have an ability to transmit electric signal, the signal line pattern 193 can be specifically prepared using a metal material, such as Cr, Al, or Cu. When the signal line pattern 193 is formed using these metal materials, the selected etching solution generally includes $HF+HNO_3+CH_3COOH+H_2O$, or $H_3PO_4+HNO_3+CH_3COOH+H_2O$. When the signal line thin film is etched by the above etching solution to obtain the signal line pattern 193, the formed signal line pattern 193 having a relatively small slope angle can be realized by increasing the volume percentage of the oxidizing agent $HNO_3$, for example, making the volume percentage of $HNO_3$ greater than 20%.

In the second mode, when the signal line thin film is etched by the etching solution, an organic additive, for example, an etching accelerator for accelerating the lateral etching reaction and an etching inhibitor for suppressing the longitudinal etching reaction, may be added to the etching solution. With the combined effect of the etching accelerator and the etch inhibitor, the etching solution has a relatively high lateral etching rate and a relatively low longitudinal etching rate. When the signal line thin film is etched by the etching solution added with the above organic additive, the etching rate of the etching solution to the lateral and longitudinal directions of the signal line thin film can be controlled to form a slope angle meeting the requirement. It should be noted that the above-mentioned lateral direction means a direction perpendicular to the extending direction of the signal line pattern 193, and the above-mentioned longitudinal direction means a direction perpendicular to the base substrate 1 in FIG. 2.

In the third mode, the temperature of the etching solution in the immersion tank is lowered. In the related art, when a thin film formed of a metal material is etched by an etching solution, the temperature of the etching solution is generally controlled to be between 40° C. and 50° C. When the signal line pattern 193 of the present embodiment is prepared, the temperature of the etching solution can be appropriately lowered, for present embodiment, the temperature of the etching solution is controlled to be between 30° C. and 40° C. This is capable of be more beneficial for slowing down the diffusion rate of the etching solution and the etching product, so that the lateral etching rate of the signal line thin film is greater than the longitudinal etching rate, thereby forming a slope angle that satisfies the requirement.

It should be noted that when the signal line pattern 193 is prepared, it is not recommended to use a shower etching method or to control the reciprocating motion of the substrate when the immersion etching method is employed. Because this will make the etching operation of the signal line thin film too uniform, and this is disadvantageous for forming a slope angle of less than 90 degrees.

After the signal line pattern 193 having the inclined side with a slope angle of less than 90 degrees is formed by the above mode, in the case that the signal line pattern 193 is packaged, a multilayer package thin film structure of silicon nitride and/or silicon dioxide may be deposited on the signal line pattern 193 by plasma enhanced chemical vapor deposition (PECVD), and an organic package thin film may be formed by an inkjet printing method, thereby packaging the signal line pattern 193. It should be noted that, since the signal line pattern 193 has an inclined side with a slope angle of less than 90 degrees, when the package layer 20 is deposited, the package material can be well deposited at the edge of the intersection between the surface of the signal line pattern 193 away from the base substrate 1 and the inclined plane of the signal line pattern 193.

It should be noted that, the structure and preparation method of the above-mentioned package layer 20 are various, but the package layer 20 is generally formed on the display component 19 after the entire display component 19 is prepared. Illustratively, a first inorganic layer may be firstly formed on the display component 19 by PECVD or atomic layer deposition using silicon oxynitride, and the first inorganic layer may have a thickness of less than 1 μm. Then, an organic layer is formed on the first inorganic layer by inkjet printing, and the thickness of the organic layer may be 8.3 μm. Finally, a second inorganic layer can be formed on the organic layer by using PECVD or atomic layer deposition using silicon nitride, and the thickness of the second inorganic layer may be less than 1 μm. It is to be noted, in the package layer 20 produced by the above method, the organic layer and the inorganic layer formed have a very good effect on preventing diffusion of impurity elements such as oxygen, sodium, boron, and water; and the organic layer has a good flattening effect, which is advantageous for forming a well-covered package layer 20 on an array substrate having a surface structure (for example, concave-convex structure), thereby meeting the requirement of efficiently blocking water and oxygen.

According to the specific structure and preparation mode of the package structure of the display component 19, in the package structure of the display component 19 provided by the embodiment of the present disclosure, a signal line pattern 193 having an inclined side with a slope angle of less than 90 degrees is arranged in the peripheral area 192 of the display component 19. With this arrangement, when the display component 19 is packaged, the package layer 20 deposited on the signal line pattern 193 has not only a larger contact area with the side of the signal line pattern 193, but also during the formation of the package layer 20, the package material can be well deposited at the edge of the intersection between the surface of the signal line pattern 193 away from the base substrate 1 and the inclined plane of the signal line pattern 193, thereby well ensuring the package effect on the signal line pattern 193. Therefore, in the package structure of the display component 19 provided by the embodiment of the present disclosure, the package effect on the signal line pattern 193 located in the peripheral area 192 of the display component 19 can be ensured, and water and oxygen are effectively prevented from invading into the inside of display component 19 from the edge position of the signal line pattern 193, thereby affecting the service life of display component 19.

Further, in the above embodiment, the signal line pattern 193 can be set to have an inclined side with a slope angle of less than 60 degrees. In this way, the contact area between the package layer 20 and the signal line pattern 193 can be better improved, thereby improving the package effect.

When the inclined side with the slope angle is prepared in the signal line pattern 193, in addition to the three modes given above, the inclined side of the signal line pattern 193 can be prepared by setting the structure and material of the signal line pattern 193. In an embodiment, the signal line pattern 193 may include a first signal line sub-pattern and a second signal line sub-pattern arranged one on another, the first signal line sub-pattern is located between the second signal line sub-pattern and the base substrate 1, and an etching selection ratio of the first signal line sub-pattern to the second signal line sub-pattern is less than one under an etching effect of the same etching solution.

By setting the signal line pattern 193 to include the first signal line sub-pattern and the second signal line sub-pattern, and the etching selection ratio of the first signal line sub-pattern and the second signal line sub-pattern less than 1, when the signal line pattern 193 is etched by the same etching solution, the etching rate of the etching solution to the second sub-pattern located on the top layer is greater than the etching rate of the etching solution to the first sub-pattern located at the bottom layer, thereby facilitating formation of a slope angle meeting the requirement. It should be noted, the etching selectivity ratio refers to how much the etching rate of one material is large compared to that of another material under the same etching condition, and it is defined as the ratio of the etching rate of one material to be etched to the etching rate of another material to be etched. A high etch selectivity ratio means that only the layer of material desired to be etched is removed, and the setting of a high etch selectivity is capable of better ensuring the critical dimensions and profile accuracy.

It should be noted, the first sub-pattern/second sub-pattern may be set to be: Cr/CrMo, or Al/AlNd, or Al/Ti, or Cu/CuMn, but is not limited thereto.

Figure 4:
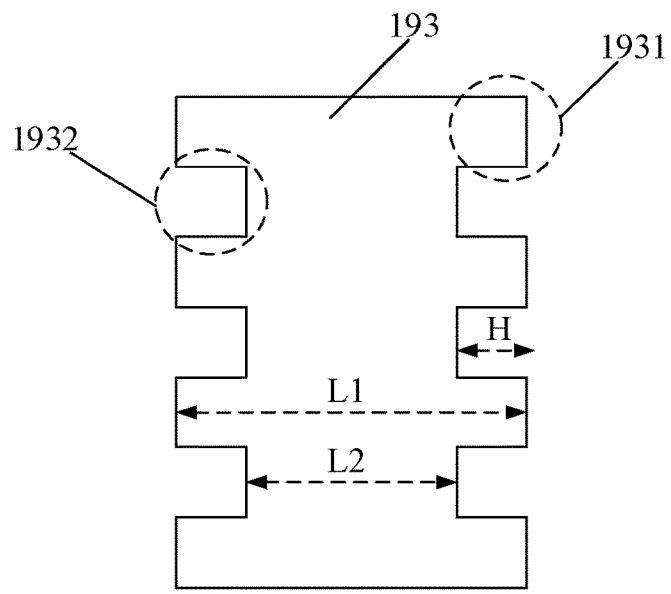
FIG. 4 is a first top plan view showing a signal line pattern according to an embodiment of the present disclosure.
Figure 5:
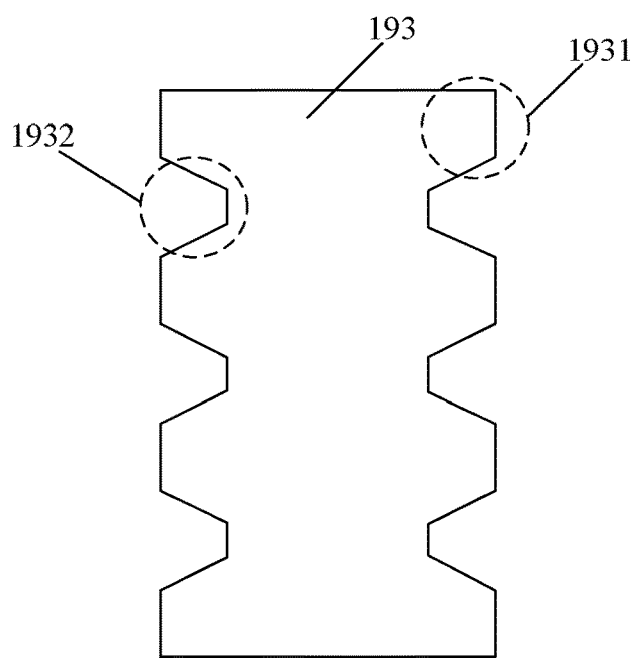
FIG. 5 is a second top plan view showing a signal line pattern according to an embodiment of the present disclosure.

Further, as shown in FIGS. 4 and 5, in the above embodiment, the inclined side of the signal line pattern 193 may have a concave-convex structure protruded or depressed along the direction perpendicular to extending direction of the signal line pattern, in which the concave-convex structure includes a plurality of convex portions 1931 spaced apart from each other, and a concave groove 1932 is formed between adjacent convex portions 1931.

By providing the inclined side of the signal line pattern 193 as a concave-convex structure, not only the contact area between the package layer 20 and the signal line pattern 193 is better improved, but also when the signal line pattern 193 is etched, the contact area between the etching solution and the signal line pattern 193 increases, and more etching solution can be collected around the signal line pattern 193 to invade and erode the signal line pattern 193, so that the etching rate of the etching solution in a direction (i.e., the lateral direction) perpendicular to the extending direction of the signal line pattern 193 is greater than the etching rate of the etching solution in a direction (i.e., the longitudinal direction) perpendicular to the base substrate 1, thereby facilitating the formation of the inclined side with a smaller slope angle on the power supply line pattern, and thereby being capable of increasing the contact area between the package layer 20 and the signal line pattern 193, improving the coverage rate of the package layer 20 on the signal line pattern 193, reducing the probability of water and oxygen intrusion, and improving the package effect.

In addition, the inclined side of the signal line pattern 193 is set to be a concave-convex structure protruded or depressed along the direction perpendicular to extending direction of the signal line pattern, so that when the package is performed, more package material can be deposited in the concave groove 1932, and a thicker package layer 20 can be formed in the concave groove 1932, thereby further improving the package effect on the signal line pattern 193. Illustratively, when the depth of the concave groove 1932 along a direction perpendicular to the extending direction of the signal line pattern 193 is between 2 μm and 10 μm, and when the package material is deposited to form the package layer 20, more thin-film package material is deposited at the concave groove 1932 in a horizontal direction parallel to the substrate, such that the thickness of the deposited package material is correspondingly increased by 2 μm to 10 μm, thereby realizing a package structure with better packaging effect.

Further, in the above embodiment, the inclined side of the signal line pattern 193 extends along the extending direction of the signal line pattern 193, the maximum width of the signal line pattern 193 along a direction perpendicular to the extending direction of the signal line pattern 193 may be, for example, between 2 μm and 30 and the minimum width of the signal line pattern 193 along a direction perpendicular to the extending direction of the signal line pattern 193 may be, for example, between 2 μm and 24 μm.

It should be noted, the signal line pattern 193 includes two inclined sides arranged on two opposite sides of the signal line pattern 193 and extending along the extending direction thereof, and these two inclined sides both have a concave-convex structure, or only one inclined side has a concave-convex structure. Illustratively, as shown in FIG. 4, when these two inclined sides both have a concave-convex structure, the convex portions 1931 located on different inclined sides at least partially overlap in a direction perpendicular to the extending direction of the signal line pattern 193, and the concave grooves 1932 located on different inclined sides at least partially overlap in a direction perpendicular to the extending direction of the signal line pattern 193, the maximum width of the signal line pattern 193 along a direction perpendicular to the extending direction of the signal line pattern 193 is L1 in FIG. 4, and the minimum width of the signal line pattern 193 along a direction perpendicular to the extending direction of the signal line pattern 193 is L2 in FIG. 4.

When the inclined side extends along the extending direction of the signal line pattern 193, the concave-convex structure provided on the inclined side will affect the width of the signal line pattern 193 along a direction perpendicular to the extending direction thereof. Illustratively, the maximum width of the signal line pattern 193 along a direction perpendicular to the extending direction of the signal line pattern 193 may be between 2 μm and 30 μm, and the minimum width of the signal line pattern 193 along a direction perpendicular to the extending direction of the signal line pattern 193 may be between 2 μm and 24 μm, so that not only the contact area between the signal line pattern 193 and the package layer 20 is ensured, but also the stability of the signal line pattern 193 for signal transmission is ensured.

It should be noted, the thickness of the signal line pattern 193 along a direction perpendicular to the substrate 1 can be set according to actual needs. Illustratively, it may be set between 100 nm and 1000 nm, but is not limited thereto.

Further, the depressed depth of the concave groove 1932 of the above-described concave-convex structure along a direction perpendicular to the extending direction of the signal line pattern 193 may be set to equal to or less than 6 μm.

By setting the depressed depth of the concave groove 1932 along a direction perpendicular to the extending direction of the signal line pattern 193 (as shown H in FIG. 4) equal to or less than 6 μm, not only the signal line pattern 193 can better ensure the etching effect in the case of satisfying the increase in contact area, but also the width of the signal line pattern 193 along a direction perpendicular to the extending direction thereof can be controlled to be relatively uniform, which is more advantageous for stable transmission of signals.

Figure 3:
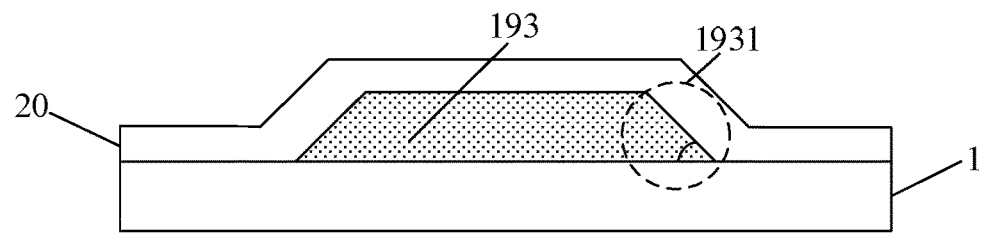
FIG. 3 is a second cross-sectional view showing a signal line pattern according to an embodiment of the present disclosure.

Further, in the above embodiment, on the inclined side of the signal line pattern 193, the slope angle of the convex portion 1931 (as shown in FIG. 3) is less than the slope angle of the groove bottom of the concave groove 1932 (as shown a in FIG. 2).

The signal line pattern 193 is generally made of a metal material, and the etching of the metal material is generally performed by a wet etching process. Illustratively, one or more of phosphoric acid, nitric acid, hydrochloric acid, hydrofluoric acid, and acetic acid may be used, an organic additive is added to form an etching solution, and a single-layer metal thin film made of Al, Cu, Mo, Ti, or AlNd is used, or a multi-layer metal thin film, such as Mo/Al/Mo or Ti/Al/Ti, is etched to form a signal line pattern 193.

Since the above-mentioned signal line pattern 193 is generally prepared by wet etching, the etching solution used for etching is more easily diffused to the convex portion 1931 of the concave-convex structure, but is not easily diffused into the concave groove 1932 of the concave-convex structure. Thus, the effective concentration of the etching solution at the position where the convex portion 1931 is located is greater than the effective concentration of the etching solution at the position where the concave groove 1932 is located, so that the slope angle of the convex portion 1931 is less than the slope angle of the groove bottom of the concave groove 1932. At the convex portion 1931 with a small slope angle, the contact area between the package layer 20 and the signal line pattern 193 is larger, and improves the coverage rate of the package layer 20 to the signal line pattern 193, thereby forming a tight package thin film on the convex portion 1931, having fewer voids, and thus reducing the probability of water and oxygen intrusion. At the concave groove 1932 with a larger slope angle, more thin-film package material is deposited along a direction parallel to the substrate 1, so that the formed package layer 20 has a larger thickness at the concave groove 1932, and has a good package effect as well.

Further, in the above embodiment, the specific shape of the convex portion 1931 in the inclined side of the signal line pattern 193 may be various. As shown in FIGS. 4 and 5, for example, the orthogonal projection of the convex portion 1931 on the base substrate 1 is rectangular, triangular, trapezoidal, and/or semi-circular, but is not limited thereto.

Further, in the above embodiment, the display component comprises a conductive film layer other than the signal line pattern, and the signal line pattern 193 and one conductive film layer of the display component 19 may be arranged in a same layer and made of a same material.

By setting the signal line pattern 193 and one conductive film layer of the display component 19 to be arranged in a same layer and made of a same material, it is possible to simultaneously form the signal line pattern 193 and one conductive film layer of the display component 19 by a single patterning process, thereby avoiding an additional patterning process to be added for preparing the signal line pattern 193.

In one embodiment, the signal line pattern 193 and the gate electrode in the display component 19 may be arranged in the same layer and made of the same material, or the signal line pattern 193 and the source and drain electrodes in the display component 19 may be arranged in the same layer and made of the same material, but not only limited thereto.

Further, in the above embodiment, the types of the signal line patterns 193 may be various. For example, the signal line pattern 193 may include a power supply line pattern.

When the signal line pattern 193 includes a power supply line pattern, the power supply line pattern may be arranged on one or more sides of the display area 191 according to actual needs. Further, the power supply line may include a cathode power supply line ELVSS for supplying a common voltage signal to the cathode in the light-emitting unit, and an anode power supply line ELVDD for supplying an anode voltage signal to the anode in the light-emitting unit.

Further, when the display component in the above embodiment is prepared, a thin-film transistor array layer is generally formed on the base substrate to form an array substrate, and then the light-emitting unit is continuously prepared on the array substrate. The array substrate may be specifically a low-temperature polysilicon thin-film field effect transistor array substrate. In the preparation process of the low-temperature polysilicon film field effect transistor array substrate, 8 to 9 mask processes are generally required. With reference to FIGS. 6A to 6H, the preparation process of the low-temperature polysilicon film field effect transistor array substrate will be described below. It should be noted, the low-temperature polysilicon thin-film field effect transistor included in the low-temperature polysilicon thin-film field effect transistor array substrate is generally formed in a display area, and the display area generally further includes a plurality of data lines and a plurality of gate lines distributed in an array.

Figure 6A:
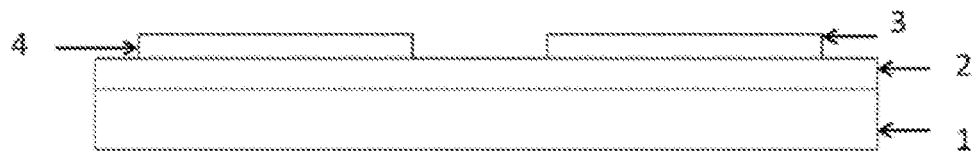
FIGS. 6A to 6H are flowcharts showing the preparation of the array substrate according to the embodiment of the present disclosure.

As shown in FIG. 6A, a silicon nitride film and a silicon oxide film are sequentially deposited on the entire base substrate 1 by PECVD, to form a buffer layer 2 composed of silicon nitride and silicon dioxide. Next, an amorphous silicon thin film is formed on the buffer layer 2 by PECVD or other chemical or physical vapor deposition method, and the amorphous silicon is crystallized into a polysilicon thin film by laser annealing (ELA) or solid phase crystallization (SPC). Then, a pattern of a photoresist layer is formed on the polysilicon film by a conventional mask process, and the polysilicon film not protected by the photoresist layer as an etch barrier layer is etched by plasma, to form a polysilicon active layer 4 and a polysilicon storage capacitor 3. The transistor channel in the polysilicon active layer 4 is doped with a low concentration ion by an ion implantation process, and a conductive channel required for the thin-film transistor is formed in the polysilicon active layer 4.

Figure 6B:
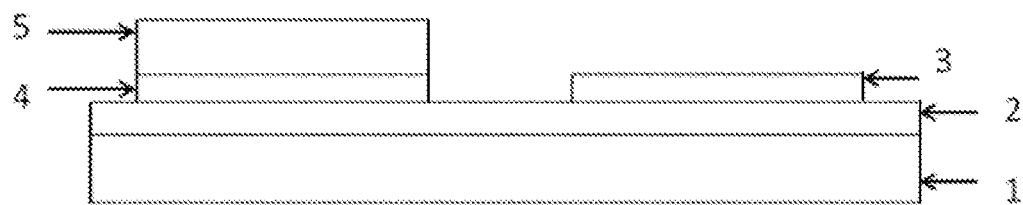

As shown in FIG. 6B, a photoresist 5 composed of a photoresist material is formed on the polysilicon active layer 4 by a mask process, to protect the polysilicon active layer 4 from ion implantation. A high-concentration ion implantation process is performed on the polysilicon storage capacitor 3 not protected by the photoresist layer, to convert the polysilicon storage capacitor 3 into a low-resistance doped polysilicon film. In the subsequent process shown in FIG. 6C to FIG. 6G, since the second plate of the capacitor composed of the gate insulating layer and the gate metal thin film is formed only on the polysilicon storage capacitor 3, the only subsequent lithography process of the polysilicon storage capacitor 3, i.e., the photolithography process of forming the second plate of the capacitor, is no longer shown in FIGS. 6C to 6G.

Figure 6C:
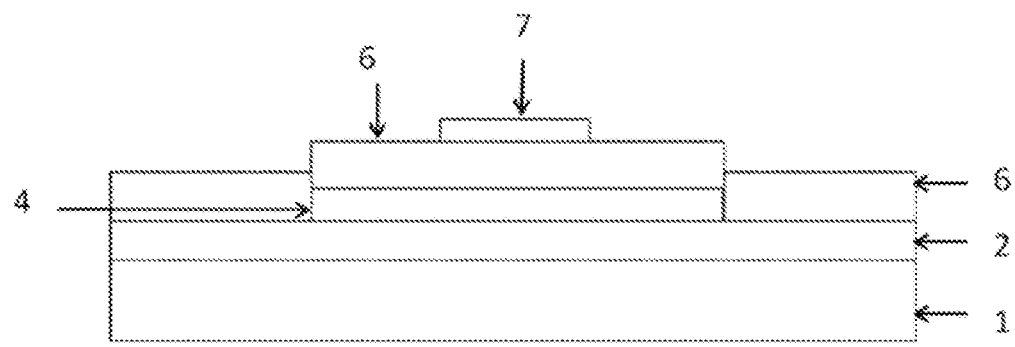

As shown in FIG. 6C, the photoresist 5 on the polysilicon active layer 4 is removed by a photoresist stripping process, a silicon dioxide film or a composite film of silicon dioxide and silicon nitride is formed by PECVD, and a gate insulating layer 6 is formed on the polysilicon storage capacitor 3, the polysilicon active layer 4 and the entire buffer layer 2. One or more low-resistance metal material thin films are deposited on the gate insulating layer 6 by a physical vapor deposition method, such as magnetron sputtering, and the gate electrode 7 is formed by a photolithography process. The gate metal thin film may include a single-layer metal thin film, such as Al, Cu, Mo, Ti, or aluminum-niobium alloy (AlNd); or may be a multilayer metal thin film, such as Mo/Al/Mo or Ti/Al/Ti. The polysilicon active layer 4 is ion doped using the gate electrode 7 as an ion implantation blocking layer, and a low impedance source and drain electrode contact area is formed in the area of the polysilicon active layer 4 not blocked by the gate electrode 7.

Figure 6D:
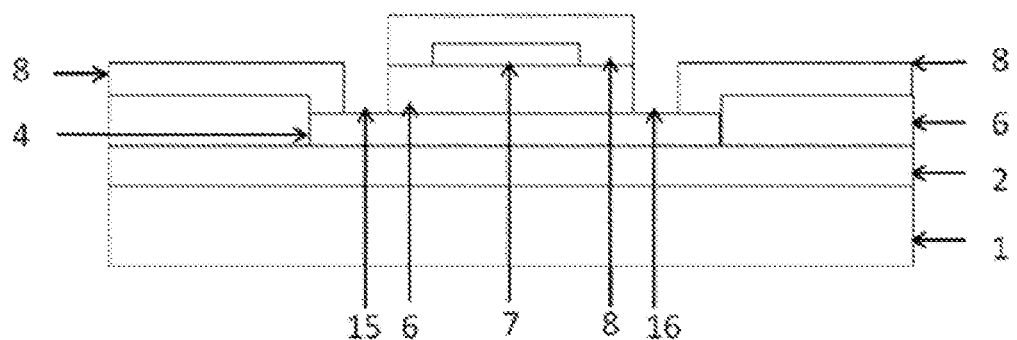

As shown in FIG. 6D, an interlayer insulating layer 8 is formed by sequentially depositing a silicon oxide film and a silicon nitride film by PECVD on the entire surface including the gate electrode 7. The source electrode contact hole 15 and the drain electrode contact hole 16 are formed by etching the interlayer insulating layer 8 by a mask process and an etching process.

Figure 6E:
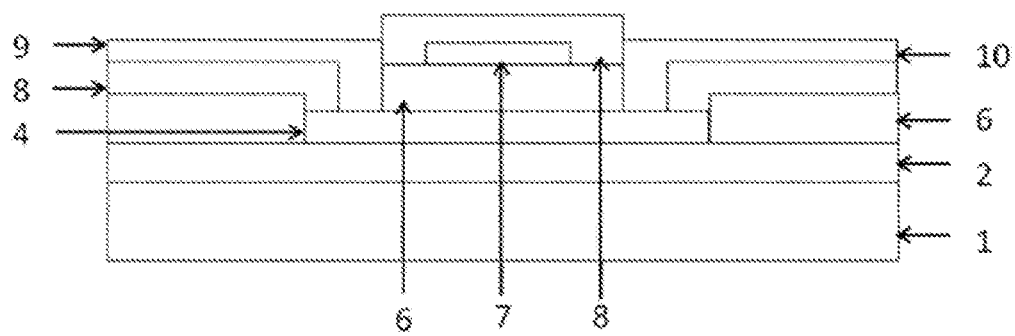

As shown in FIG. 6E, one or more low-resistance metal thin films are deposited on the interlayer insulating layer 8, the source electrode contact holes 15 and the drain electrode contact holes 16 by magnetron sputtering, and the source electrode 9 and the drain electrode 10 are formed by through a mask process and an etching process. The source electrode 9 and the drain electrode 10 form an ohmic contact with the polysilicon active layer 4 through the source electrode contact hole 15 and the drain electrode contact hole 16, respectively. The ions doped in the polysilicon active layer 4 are activated by using rapid thermal annealing or heat treatment furnace annealing, to form an effective conductive channel in the polysilicon active layer 4 under the gate electrode 7. It should be noted, the above-mentioned metal thin film for forming the source electrode 9 and the drain electrode 10 may be a single-layer metal thin film, such as Al, Cu, Mo, Ti or AlNd; or may be a multi-layer metal thin film, such as Mo/Al/Mo or Ti/Al/Ti.

Figure 6F:
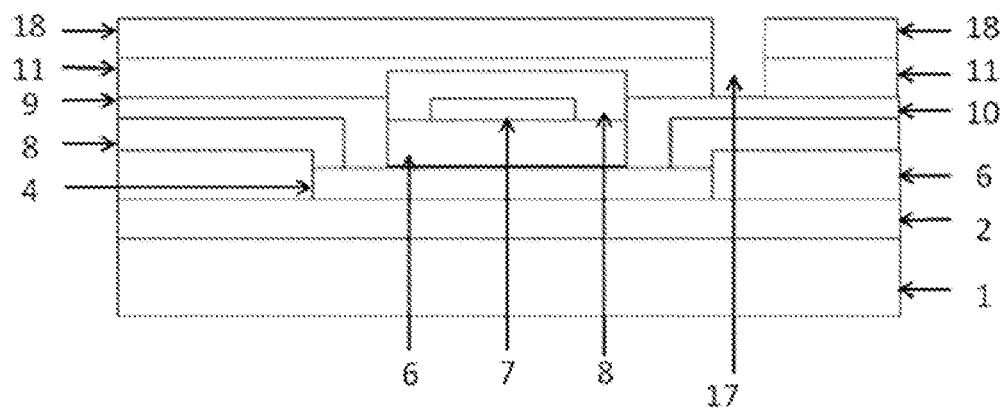

As shown in FIG. 6F, a silicon nitride film is deposited on the entire surface including the source electrode 9 and the drain electrode 10 by PECVD, and a passivation layer 11 including a via hole 17 is formed by a mask process and an etching process. A hydrogenation process is performed by using rapid thermal annealing or heat treatment furnace annealing, to repair defects in the inside and interface of the polysilicon active layer 4. Once again, through the mask process, an organic planarization layer 18 having the same via hole as the via hole 17 is formed on the passivation layer 11, to fill the surface of the component and to form a flat surface.

Figure 6G:
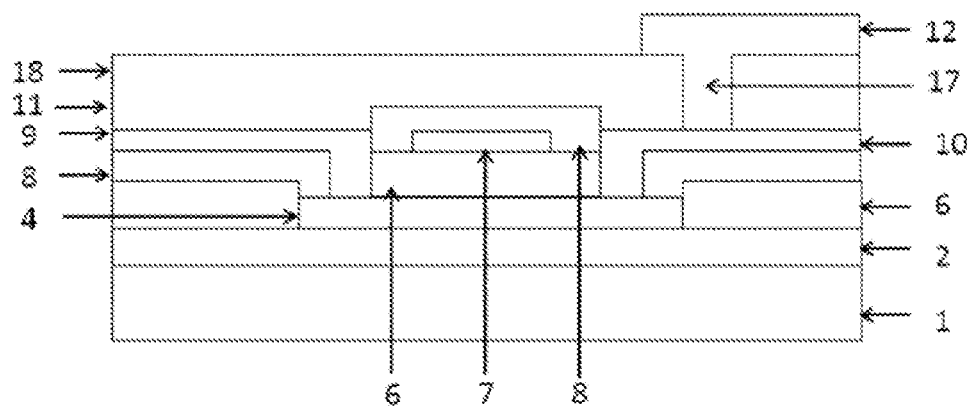
Figure 6H:
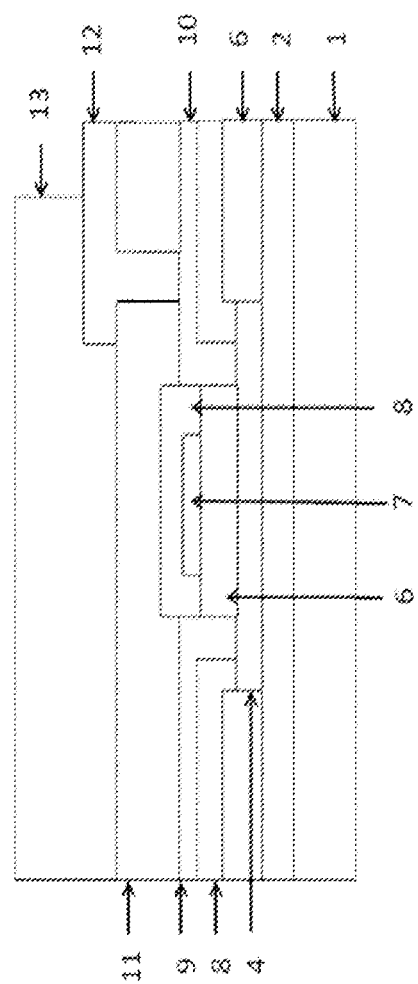

As shown in FIG. 6G, a transparent conductive thin film is deposited on the organic planarization layer 18 and the via hole 17 by magnetron sputtering, the transparent conductive thin film is etched by a photolithography process, and a pixel electrode 12 of a pixel region is formed on the via hole 17 and a portion of the organic planarization layer 18. Then, a photosensitive organic material similar to the organic planarization layer 18 is coated on the organic planarization layer 18 and the pixel electrode 12, and a partial area of the pixel electrode 12 is exposed through a final mask process, to form the pixel definition layer 13 as shown in FIG. 6H. The pixel definition layer 13 covers the organic planarization layer 18 and a portion of the pixel electrode 12 region. It should be noted, the transparent conductive thin film for forming the pixel electrode 12 may be a single-layer oxide conductive thin film, such as indium tin oxide (ITO) or indium zinc oxide (IZO), or may be a composite film, such as ITO/Ag/ITO or IZO/Ag.

According to the preparation process of FIG. 6A to FIG. 6H described above, at least 8 to 9 photolithography processes are required to form the low-temperature polysilicon thin-film field effect transistor array substrate as shown in FIG. 6H.

An embodiment of the present disclosure also provides a display device including any one of the above display substrate.

In the display substrate provided by any one of the above embodiments of the present disclosure, the package effect on the signal line pattern located in the peripheral area of the display component can be ensured, and water and oxygen are effectively prevented from invading into the inside of display component from the edge position of the signal line pattern, thereby affecting the service life of display component. Therefore, the display device provided in the present embodiment also has the above effects when the above display substrate is included, and details are not described herein again, and details are not repeated herein.

Unless otherwise defined, technical terms or scientific terms used herein have the normal meaning commonly understood by one skilled in the art in the field of the present disclosure. The words "first", "second", and the like used in the present disclosure does not denote any order, quantity, or importance, but rather merely serves to distinguish different components. The "including", "comprising", and the like used in the present disclosure means that the element or item appeared in front of the word encompasses the element or item and their equivalents listed after the word, and does exclude other elements or items. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly.

It will be understood that when an element, such as a layer, film, region, or substrate, is referred to as being "on" or "under" another element, the element may be directly "on" or "under" another element, or there may be an intermediate element.

In the description of the above specific embodiments, the specific features, structures, materials or features may be combined in any suitable manner in any one or more embodiments or examples.

The above description is merely the specific embodiment of the present disclosure, but the scope of the present disclosure is not limited thereto. Moreover, any person skilled in the art would readily conceive of modifications or substitutions within the technical scope of the present disclosure, and these modifications or substitutions shall also fall within the protection scope of the present disclosure. Therefore, the protection scope of the present disclosure should be determined by the scope of the claims.

What is claimed is:

1. A display substrate, comprising:
   a base substrate;
   a display component arranged on a surface of the base substrate; and
   a package layer covering the display component,
   wherein the display component comprises:
      a display area; and
      a peripheral area surrounding the display area, the peripheral area provided with a signal line pattern having an inclined side with a slope angle of less than 90 degrees along a direction perpendicular to an extending direction of the signal line pattern,
   wherein the signal line pattern comprises a first signal line sub-pattern and a second signal line sub-pattern arranged one on another, the first signal line sub-pattern is located between the second signal line sub-pattern and the base substrate, and an etching selection ratio of the first signal line sub-pattern to the second signal line sub-pattern is less than one under an etching effect of the same etching solution,
   wherein the inclined side has a concave-convex structure protruded or depressed along the direction perpendicular to extending direction of the signal line pattern, the concave-convex structure comprises a plurality of convex portions spaced apart from each other, and a concave groove is formed between adjacent two of the plurality of convex portions,
   wherein a depth of the concave groove along a direction perpendicular to the extending direction of the signal line pattern is between 2 μm and 10 μm, such that the thickness of the deposited package material is correspondingly increased by 2 μm to 10 μm,
   wherein a thickness of the convex portion is equal to a thickness of the concave groove, and
   wherein a slope angle of the convex portion is less than a slope angle of a groove bottom of the concave groove.

2. The display substrate of claim 1, wherein the signal line pattern has an inclined side with a slope angle of less than 60 degrees.

3. The display substrate of claim 1, wherein the inclined side extends along an extending direction of the signal line pattern, and a maximum width of the signal line pattern along a direction perpendicular to the extending direction of the signal line pattern is between 2 μm and 30 μm.

4. The display substrate of claim 1, wherein a minimum width of the signal line pattern along a direction perpendicular to an extending direction of the signal line pattern is between 2 μm and 24 μm.

5. The display substrate of claim 1, wherein a depressed depth of the concave groove along a direction perpendicular to an extending direction of the signal line pattern is equal to or less than 6 μm.

6. The display substrate of claim 1, wherein an orthogonal projection of the convex portion on the base substrate is rectangular, triangular, trapezoidal, and/or semicircular.

7. The display substrate of claim 1, wherein the display component comprises a conductive film layer other than the signal line pattern, and the signal line pattern and the conductive film layer of the display component are arranged in a same layer and made of a same material.

8. The display substrate of claim 1, wherein the signal line pattern comprises a power supply line pattern.

9. A display device comprising the display substrate of claim 1.

10. The display device of claim 9, wherein the signal line pattern has an inclined side with a slope angle of less than 60 degrees.

11. The display device of claim 9, wherein the inclined side extends along an extending direction of the signal line pattern, and a maximum width of the signal line pattern along a direction perpendicular to the extending direction of the signal line pattern is between 2 μm and 30 μm.

12. The display device of claim 9, wherein a minimum width of the signal line pattern along a direction perpendicular to an extending direction of the signal line pattern is between 2 μm and 24 μm.

13. The display device of claim 9, wherein a depressed depth of the concave groove along a direction perpendicular to an extending direction of the signal line pattern is equal to or less than 6 μm.

14. The display device of claim 9, wherein an orthogonal projection of the convex portion on the base substrate is rectangular, triangular, trapezoidal, and/or semicircular.

* * * * *